United States Patent
Hattori

(10) Patent No.: US 7,741,988 B2
(45) Date of Patent: Jun. 22, 2010

(54) ANALOG-DIGITAL CONVERTER, SOLID-STATE IMAGE CAPTURING APPARATUS, AND ELECTRONIC INFORMATION DEVICE

(75) Inventor: Shinji Hattori, Higashiosaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/152,705

(22) Filed: May 16, 2008

(65) Prior Publication Data

US 2008/0284626 A1 Nov. 20, 2008

(30) Foreign Application Priority Data

May 16, 2007 (JP) .............................. 2007-131068

(51) Int. Cl.
H03M 1/56 (2006.01)

(52) U.S. Cl. ....................................... 341/169; 341/156
(58) Field of Classification Search ................. 341/169, 341/172, 155, 133, 156
See application file for complete search history.

(56) References Cited

U.S. PATENT DOCUMENTS 5,321,404 A 6/1994 Mallinson et al.
2006/0012507 A1* 1/2006 Nitta et al. .................. 341/156

FOREIGN PATENT DOCUMENTS

KR 2006-0052524 5/2006

OTHER PUBLICATIONS

Office Action for Korean U.S. Appl. No. 10-2008-0045452 mailed Jan. 11, 2010.

* cited by examiner

Primary Examiner—Rexford N Barnie
Assistant Examiner—Joseph Lauture
(74) Attorney, Agent, or Firm—Edwards Angell Palmer & Dodge LLP; David G. Conlin; Catherine J. Toppin

(57) ABSTRACT

An analog-digital converter is provided. The analog-digital converter includes: a comparing section for comparing an input signal voltage and an analog ramp voltage in which a voltage level gradually increases; and a latch section for storing a digital value of a digital ramp signal, in which a digital value of a voltage level gradually increases in synchronization with the analog ramp voltage when the analog ramp voltage or a voltage corresponding to the analog ramp voltage and the input signal voltage are equal. A voltage in which part or all of a plurality of analog ramp signals are added is used as the analog ramp voltage so that a gain is selectable.

22 Claims, 7 Drawing Sheets

US 7,741,988 B2

ANALOG-DIGITAL CONVERTER, SOLID-STATE IMAGE CAPTURING APPARATUS, AND ELECTRONIC INFORMATION DEVICE

This Nonprovisional Application claims priority under 35 U.S.C. §119(a) on Patent Application No. 2007-131068 filed in Japan on May 16, 2007, the entire contents of which are hereby incorporated by reference.

BACKGROUND OF THE INVENTION

1. Field of the Invention

The present invention relates to an analog-digital converter in which a gain can be selected when an analog image signal is converted into a digital image signal and the digital image is output: a solid-state image capturing apparatus using the analog-digital converter to make it possible to capture an image light from a subject; and an electronic information device, such as a digital camera (e.g., a digital video camera, a digital still camera), an image input scanner, a facsimile machine, a cell phone device equipped with a camera and the like, using the solid-state image capturing apparatus as an image input device for an image capturing section.

2. Description of the Related Art

As disclosed in Reference 1, in a solid-state image capturing apparatus, such as a conventional CMOS image sensor, when converting an analog image signal into a digital image signal and being output, an input signal amplifier in an analog-digital converter selects a high gain to make a bright image if the voltage level of an imaging data from a pixel section is too low. Such a conventional image sensor is shown in FIG. 8.

FIG. 8 is a block diagram showing an exemplary essential structure of a conventional CMOS image sensor. Although the actual pixel arrangement has, for example, 1200 rows× 1600 columns, for the sake of simplicity, the pixel arrangement which includes a pixel section has four rows and four columns as shown in FIG. 8.

In FIG. 8, a conventional CMOS image sensor 100 includes: a plurality of pixel sections 101, which are arranged in two dimensional matrix; a y-axis decoder 102 for sequentially selecting each row in a pixel arrangement; a plurality of amplifiers (input signal amplifier) 103 for amplifying an output voltage of each column in the pixel arrangement; a plurality of comparators 104 for comparing an input voltage of each amplifier 103 with an analog ramp voltage ARMP (the ramp means a tilt); a digital latch section 105 for storing a digital ramp signal DRMP (multiple bit data) when the input voltage and the analog ramp voltage ARMP from each amplifier 103 are equal; an x-axis decoder 106 for sequentially selecting each column of the pixel arrangement by sequentially selecting latch sections 105 so that a signal is output to a plurality of bit lines; an analog ramp generator 107 for generating the analog ramp voltage ARMP, which is a triangular wave that sequentially increases the voltage level; and a digital ramp generator 108 for generating a digital ramp signal DRMP, in which a digital value sequentially increases in synchronization with the analog ramp voltage ARMP. In addition, a conventional analog-digital converter is configured with the amplifier 103, the comparator 104, the latch section 105, the analog ramp generator 107, and the digital ramp generator 108.

In the conventional CMOS image sensor 100 with the structure described above, an incident light (a subject light) is first photoelectrically converted by each pixel section 101 and is then output as an imaging signal voltage. In the y-axis decoder 102, only one row is selected sequentially from the pixel arrangement in accordance with an inputted address signal YADDR. An output voltage selected from one row of pixel sections 101 is amplified via the corresponding amplifier 103 and is input into a corresponding comparator 104. Each amplifier 103 is a gain selecting section, where, for example, an original gain and a doubled gain are selected in accordance with a selecting signal GSEL, so that the output voltage from each pixel section 101 is amplified.

Subsequently, the analog ramp voltage ARMP and the input voltage are compared with each other in each comparator 104, and when both are equal to each other, the digital ramp signal DRMP, which increases the voltage level in synchronization with the analog ramp voltage ARMP, is stored in the latch section 105. That is, a digital value of a digital ramp signal DRMP, which is at the same voltage level as the analog ramp voltage ARMP, is stored in the latch section 105 when the analog ramp signal DRMP increases and has the same voltage level as the voltage level of the input voltage of the pixel section 101. As a result, the input voltage of the pixel section 101 is said to be analog-digital converted.

In this way, subsequent to the completion of an analog-digital converting operation for one row, each latch section 105 is sequentially selected at the x-axis decoder 106 in accordance with an inputted address signal XADDR, and each latched digital ramp signal DRMP is sequentially output as an analog-digital converting output signal DOUT.

A clock signal CLOCK and a synchronizing signal SYNC are input to the analog ramp generator 107 and the digital ramp generator 108. The analog ramp voltage ARMP, which is gradually increased the voltage level, is generated at the analog ramp generator 107, whereas a digital ramp signal DRMP is generated at the digital ramp generator 108, the digital ramp signal DRMP changing such that the digital ramp signal is increased its voltage level in synchronization with the analog ramp voltage ARMP.

A series of analog-digital converting operations described above are performed for every row in the pixel arrangement, so that the information of a digital image is output as image data.

Reference 1: Japanese Laid-Open Publication No. 2006-50231

SUMMARY OF THE INVENTION

However, the amplifier 103, as a gain selecting section, is provided for each of the multiply arranged columns in the pixel arrangement in the conventional image sensor 100 described above and shown in FIG. 8, and therefore a large number of the amplifiers 103 are necessary. For example, one thousand and six hundreds of amplifiers, which is a large number, are necessary in a case where the pixel arrangement is 1200 rows×1600 columns. Moreover, the amplifier 103 as a gain selecting section is a complicated circuit that has many transistors in its control circuit due to the necessity of outputting an accurate gain, compared with the comparator as a comparing section. Therefore, a problem arises that the area occupied by IC chips of a large number of amplifiers 103 as well as the electric power consumption increase. For example, a cell phone equipped with a camera has only a small space, thereby the problem becomes obvious. Moreover, a problem arises that gain accuracy for the amplifiers 103 may vary due to the production tolerance.

The present invention is intended to solve the conventional problems described above. The objective of the present invention is to provide an analog-digital converter, in which each column does not require a corresponding amplifier as a gain selecting section and gain is selected accurately, thereby decreasing an area occupied by the circuitry and reducing the electric power consumption; a solid-state image capturing apparatus using the analog-digital converter; and an electronic information device using the solid-state image capturing apparatus as an image input device for an image capturing section.

An analog-digital converter according to the present invention includes: a comparing section for comparing an input signal voltage and an analog ramp voltage in which a voltage level gradually increases; and a latch section for storing a digital value of a digital ramp signal, in which a digital value of a voltage level gradually increases in synchronization with the analog ramp voltage when the analog ramp voltage or a voltage corresponding to the analog ramp voltage and the input signal voltage are equal; wherein a voltage in which part or all of a plurality of analog ramp signals are added is used as the analog ramp voltage so that a gain is selectable, thereby achieving the objective described above.

Preferably, an analog-digital converter according to the present invention further includes an analog ramp generating section for generating the analog ramp signal and a digital ramp generating section for generating the digital ramp signal.

Still preferably, an analog-digital converter according to the present invention further includes a first gain selecting section for branching an output of the analog ramp signal from the analog ramp generating section into a plurality of outputs to allow at least one of the outputs to be switched to a fixed voltage output.

Still preferably, in an analog-digital converter according to the present invention, the first gain selecting section is a gain selecting switch, the gain selecting switch switching between at least one of the plurality of analog ramp signals and the fixed voltage by the first gain selecting signal so that a gain is selectable.

Still preferably, in an analog-digital converter according to the present invention, the analog ramp generating section includes a second gain selecting section for changing a tilt amount of the analog ramp signal.

Still preferably, in an analog-digital converter according to the present invention, and in the comparing section, an input of the input signal voltage is connected to a first connecting point through a third switch; a first analog ramp signal is connected to the first connecting point through a first capacitor; a second analog ramp signal is connected to the first connecting point through a second capacitor . . . and an n-th analog ramp signal is connected to the first connecting point through an n-th capacitor (n is an integer greater or equal to 2); the first connecting point is connected to the input of a CMOS inverter through a series circuit of a fourth switch and a comparing capacitor; and the output of the CMOS inverter is connected to the output of a comparator output, thereby configuring a sampling and comparing section.

Still preferably, in an analog-digital converter according to the present invention, and in the comparing section, the input of the input signal voltage is connected through a first switch to a second connecting point in between the fourth switch and the comparing capacitor, and a third connecting point in between the comparing capacitor and inputs of the CMOS inverter is connected to the output of the CMOS inverter through a second switch, thereby configuring a resetting section.

Still preferably, in an analog-digital converter according to the present invention, and in the comparing section, the CMOS inverter is connected in between outputs of a high electric potential power source and a low electric potential power source, and the first connecting point is connected to the output of the low electric potential power source through an additional capacitor.

Still preferably, in an analog-digital converter according to the present invention, when the first switch and the second switch are in the on state and the third switch and the fourth switch are in the off state, the comparing section is in the reset state and the input and output of the CMOS inverter are reset to the equal voltage, and an input reset voltage is charged in the comparing capacitor.

Still preferably, in an analog-digital converter according to the present invention, when the third switch is in the on state, the comparing section is in a sampling state and the input signal voltage is charged to the first capacitor, the second capacitor, . . . and the n-th capacitor; an input voltage V1 is a difference between an input reset voltage and the input signal voltage, the input reset voltage charged to the comparing capacitor during a resetting period; when the third switch is in the off state and the fourth switch is in the on state, the comparing section is in a comparing state and the voltage level changes with the constant tilt amount of at least one of the first analog ramp signal, the second analog ramp signal . . . and the n-th analog ramp signal, and the comparing output changes at the time when an added voltage of the first analog ramp signal, the second analog ramp signal . . . and the n-th analog ramp signal reaches a predetermined voltage V2.

Still preferably, in an analog-digital converter according to the present invention, when the first switch, the second switch and the fourth switch are in the off state and the third switch is in the on state, the comparing section is in a sampling state and the input signal voltage is charged to the first capacitor, the second capacitor . . . and the n-th capacitor; and an input voltage V1 is a difference between a input reset voltage, which is charged to the comparing capacitor during a resetting period, and the input signal voltage; the comparing section is in a comparing state when the first switch, the second switch and the third switch are in the off state and the fourth switch is in the on state; and the voltage level changes with the constant tilt amount of at least either of the first analog ramp signal and the second analog ramp signal, and the comparing output changes at the time when an added voltage of the first analog ramp signal, the second analog ramp signal . . . and the n-th analog ramp signal reaches a predetermined voltage V2.

Still preferably, in an analog-digital converter according to the present invention, when the first switch and the second switch are in the on state and the third switch and the fourth switch are in the off state, the comparing section is in a reset state and the input and output of the CMOS inverter are reset to the equal voltage; and the input reset voltage is charged to the comparing capacitor; the comparing section is in a sampling state when the first switch, the second switch and the fourth switch are in the off state and the third switch is in the on state; and the input signal voltage is charged to the first capacitor, the second capacitor . . . the n-th capacitor and the additional capacitor, and the input voltage V1 is a difference between the input reset voltage and the input signal voltage; the comparing section is in a comparing state when the first switch, the second switch and the third switch are in the off state and the fourth switch is in the on state; and the voltage level changes with the constant tilt amount of at least one of the first analog ramp signal, the second analog ramp signal . . . and the n-th analog ramp signal, and the comparator output changes at the time when an added voltage of the first analog ramp signal, the second analog ramp signal . . . and the n-th analog ramp signal reaches a predetermined voltage V2.

Still preferably, in an analog-digital converter according to the present invention, a gain G, which is the ratio of the input voltage V1 and the predetermined voltage V2, is determined in the comparing section by dividing the sum of respective capacitance of the first capacitor, the second capacitor . . . the n-th capacitor by the sum of respective capacitors that respond to one or a plurality of analog ramp signals when one or a plurality of the analog ramp signals of the first analog ramp signal, the second analog ramp signal . . . the n-th analog ramp signal are changed and the rest of the analog ramp signals are fixed.

Still preferably, in an analog-digital converter according to the present invention, a gain G, which is the ratio of the input voltage V1 and the predetermined voltage V2, is determined in the comparing section by dividing the sum of respective capacitance of the first capacitor, the second capacitor . . . the n-th capacitor and the additional capacitor by the sum of respective capacitors that respond to one or a plurality of analog ramp signals when one or a plurality of the analog ramp signals of the first analog ramp signal, the second analog ramp signal . . . the n-th analog ramp signal are changed and the rest of the analog ramp signals are fixed.

Still preferably, in an analog-digital converter according to the present invention, a gain G, which is the ratio of the input voltage V1 and the predetermined voltage V2, is determined in the comparing section by the following equations (1) and (2″) through (4″) in accordance with the capacity ratio of the first capacitor C1, the second capacitor C2 . . . the n-th capacitor Cn, the comparing capacitor C and an additional capacitor CT;

$$V2 = G \times V1 \qquad \text{equation (1)}$$

$$G = (C1 + C2 + CT)/C1 \qquad \text{equation (2″)}$$

if the first analog ramp signal is changed and the second analog ramp signal is fixed;

$$G = (C1 + C2 + CT)/C2 \qquad \text{equation (3″)}$$

if the first analog ramp signal is fixed and the second analog ramp signal is changed;

$$G = (C1 + C2 + CT)/(C1 + C2) \qquad \text{equation (4″)}$$

if both the first analog ramp signal and the second analog ramp signal are changed.

Still preferably, in an analog-digital converter according to the present invention, and in the analog ramp generating section, the output of a differential amplifier is connected to an output of an analog ramp generating output, and the output of the analog ramp generating output is connected to the negative input of the differential amplifier through a parallel circuit of the seventh capacitor and the sixth switch; the positive input of the differential amplifier is connected to an analog ground point, and a sixth connecting point is connected to the analog ground point through a fifth capacitor as well as to the analog ground point through a series circuit of a seventh switch and a sixth capacitor; and the sixth connecting point is connected to the input of a reference voltage or the negative input of the differential amplifier through a fifth switch.

Still preferably, in an analog-digital converter according to the present invention, additional series circuits, which are the same as the series circuit of the seventh switch and the sixth capacitor, are provided in such a manner that a series circuit of the seven—1st switch and the six—1st capacitor . . . a series circuit of a seven—mth switch and a six—mth capacitor are in parallel with each other.

Still preferably, in an analog-digital converter according to the present invention, and in the analog ramp generating section, the sixth switch is controlled to open and close by a synchronizing signal, and the analog ramp generating output is reset to the voltage value of 0V when the synchronizing signal is "1"; the seventh switch is controlled to open and close by a second gain selecting signal, and the fifth capacitor and the sixth capacitor are connected in parallel when the second gain selecting signal is "1"; the fifth switch is switch-controlled by a clock signal, and electric charge of the fifth capacitor is transferred to the seventh capacitor when the synchronizing signal is "0" and the second gain selecting signal is "0"; and electric charges of the fifth capacitor and the sixth capacitor are transferred to the seventh capacitor when the synchronizing signal is "0" and the second gain selecting signal is "1".

Still preferably, in an analog-digital converter according to the present invention, in the analog ramp generating section, the sixth switch is controlled to open and close by a synchronizing signal, and the analog ramp generating output is reset to the voltage value of 0V when the synchronizing signal is "1"; a second gain selecting signal is configured with a plurality of gain selecting signals, and the seven–mth switch is controlled to open and close by the plurality of gain selecting switch, and one or a plurality of the six–nth capacitors, which correspond to the gain selecting signal "1" of the plurality of gain selecting signals, and the fifth capacitor are connected in parallel; the fifth switch is switch-controlled by the clock signal, and electric charge of the fifth capacitor is transferred to the seventh capacitor when the synchronizing signal is "0" and the second gain selecting signal is "0"; and electric charges of one or a plurality of the six–mth capacitors and the fifth capacitor are transferred to the seventh capacitor when the synchronizing signal is "0" and the plurality of gain selecting signals are "1".

A solid-state image capturing apparatus according to the present invention includes: a plurality of pixel sections arranged in a matrix for photoelectrically converting an incident light into an electron and outputting it as an input signal voltage; a y-axis decoder for sequentially selecting each column in a pixel arrangement; an x-axis decoder for selecting each row in a pixel arrangement; and an analog-digital converter according to the present invention, thereby achieving the objective described above.

An electronic information device according to the present invention uses either the analog-digital converter according to the present invention or the solid-state image capturing apparatus according to the present invention, thereby achieving the objective described above.

The functions of the present invention having the structures described above will be described hereinafter.

According to the present invention, the analog-digital converter includes a comparator for comparing the input voltage with the analog ramp voltage, the analog ramp voltage being a triangular wave that gradually increases the voltage level; and a latch section for storing a digital ramp signal, in which a digital value of a voltage level gradually increases in synchronization with the analog ramp voltage, when both the input voltage and the analog ramp voltage are equal. A voltage, which is the sum of a plurality of analog ramp signals, is used as the analog ramp voltage in the analog-digital converter. A gain selecting switch as a first gain selecting section is switched by a first gain selecting signal, so that at least one of a plurality of signals is branched from the analog ramp signal, which is outputted from the analog ramp generator, can be changed to a fixed voltage, thereby allowing the selection of a gain. Further, in addition to or separately from this gain selection, a second gain selecting signal as a second gain selecting section changes a tilt amount of a triangular wave of the analog ramp signal that is generated from the analog ramp generator, so that a gain is selectable.

According to the present invention as described above, the analog ramp signal and the fixed voltage are changed by the gain selecting signal and the switch; and the tilt amount of the triangular wave is changed so as to select a gain without using a plurality of amplifiers as the gain selecting section for each column. As a result, an area occupied by chips is decreased and the electric power consumption is reduced since a plurality of amplifiers are not necessary to be provided, compared with the prior art. In addition, the accuracy of a gain is controllable with a capacity ratio of a capacitor that configures as a comparison circuit, so that an influence due to the production tolerance can be reduced.

These and other advantages of the present invention will become apparent to those skilled in the art upon reading and understanding the following detailed description with reference to the accompanying figures.

Figure 1:
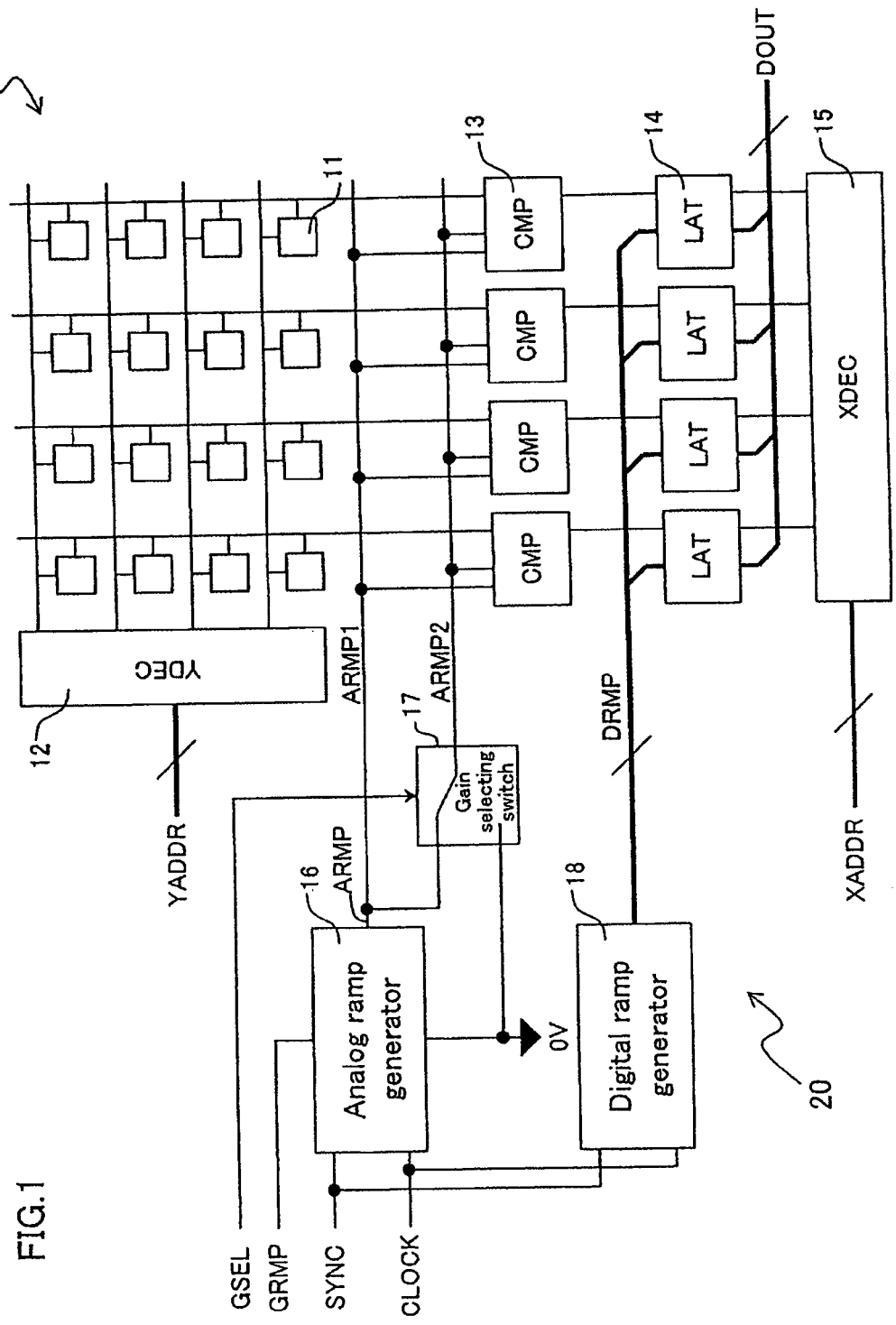
FIG. 1 is a block diagram showing an exemplary essential structure of an image sensor according to Embodiment 1 of the present invention.

10 image sensor
11 pixel section
12 y-axis decoder
13, 13A comparator (comparing section)
14 latch section
15 x-axis decoder
16 analog ramp generator (analog ramp generating section)
17 gain selecting switch (gain selecting section)
18 digital ramp generator (digital ramp generating section)
20 analog-digital converter
21-27 connecting point
31 inverter
32 difference amplifier
SW1-SW7 switch
C1-C7 capacitor
90 electronic information device
92 memory section
93 display section
94 communication section
95 image output section

DESCRIPTION OF THE PREFERRED EMBODIMENTS

Embodiments 1 to 3 of an analog-digital converter according to the present invention will be described hereinafter in detail with respect to the accompanying figures, where the analog-digital converter is applied to an image sensor that functions as a solid-state image capturing apparatus.

Embodiment 1

FIG. 1 is a block diagram showing an exemplary essential structure of an image sensor according to Embodiment 1 of the present invention. In FIG. 1, the pixel arrangement which includes a large number of pixel sections has four rows and four columns for the sake of simplicity although the actual pixel arrangement has, for example, 1200 rows×1600 columns.

In FIG. 1, an image sensor 10 according to Embodiment 1 includes: a plurality of pixel sections 11, which are arranged in two dimensional matrix in row and column directions; a y-axis decoder 12 for sequentially selecting each row in a pixel arrangement; a comparator 13 functioning as a comparing section for every column for comparing an input voltage that is an output voltage from each column in the pixel arrangement and an analog ramp voltage, which is the sum of an analog ramp signal ARMP1 and an analog ramp signal ARMP2; a latch section 14 for storing a digital ramp signal DRMP when the input voltage (pixel voltage) and the analog ramp voltage (or an voltage corresponding to the analog ramp voltage) from each column are equal (in an equal timing) (in the timing when both voltages are equal); an x-axis decoder 15 for sequentially selecting each column in the pixel arrangement by sequentially selecting a latch section 14; an analog ramp generator 16 functioning as an analog ramp generating section for generating a fixed voltage (ground voltage of 0V herein) and an analog ramp signal ARMP1, in which a voltage level gradually increases; a gain selecting switch 17 functioning as a first gain selecting section, in which an output of the analog ramp signal ARMP1 outputted from the analog ramp generator 16 branches into two outputs (i.e., the output branches to an output for the analog ramp signal ARMP1 and an output for the analog ramp signal ARMP2, the analog ramp signals ARMP1 and ARMP2 being the same signal in this case), and one of the two outputs and a fixed voltage output are allowed to be switched in accordance with a first gain selecting signal GSEL; and a digital ramp generator 18 functioning as a digital ramp generating section for generating a digital ramp signal DRMP in which a digital value of a voltage level gradually increases in synchronization with the analog ramp voltage. An analog-digital converter 20 is configured with the comparator 13, the latch section 14, the analog ramp generator 16, the gain selecting switch 17 and the digital ramp generator 18.

The analog-digital converter uses the voltage which is the sum of a plurality of analog ramp signals, as the analog ramp voltage as described before and is provided with the first gain selecting section for branching an output for the analog ramp signal ARMP1 from the analog ramp generator 16 and switching at least one of the branched outputs into a fixed voltage output. Herein, the gain selecting switch 17 is provided as a first gain selecting section for switching one of the two branched signals from the analog ramp signal into a fixed voltage in accordance with the first gain selecting signal GSEL. Further, a second gain selecting section is provided for changing the tilt amount of the analog ramp signal in accordance with a second gain selecting signal GRMP.

With the structure described above, the image sensor 10 photoelectrically converts an incident light into electrons by a large number of pixel sections 11. The y-axis decoder 12 sequentially selects only one row from the pixel arrangement in accordance with the address signal YADDR, and an output voltage of the selected row from each pixel section 11 is input as an input voltage into a corresponding comparator 13.

Subsequently, the comparator 13 compares the analog ramp voltage and the input voltage, in which the analog ramp voltage is the sum of the first analog ramp signal ARMP1 and the second analog ramp signal ARMP2 (the analog ramp voltage is an integral multiple of the first analog ramp signal ARMP1, and it is a voltage and another voltage two times the voltage herein), and when the two voltages are equal, a digital value of a voltage level of the digital ramp signal DRMP is stored in the latch section 14. At that time, a clock signal CLOCK and a synchronizing signal SYNC are input in the analog ramp generator 16 and the digital ramp generator 18. The analog ramp generator 16 generates an analog ramp signal ARMP, which is a gradually increasing triangular wave. An output of the analog ramp generator 16 is branched into two outputs, and it allows one of the two outputs to be output as a first analog ramp signal ARMP1 and the other to be output via the gain selecting switch 17 as a second analog ramp signal ARMP2. The gain selecting switch 17 is capable of fixing the second analog ramp signal ARMP2 into a fixed voltage in accordance with the first gain selecting signal GSEL. In addition, the analog ramp generator 16 selects a tilt amount for the first analog ramp signal ARMP1 and the second analog ramp signal ARMP2 in accordance with the second gain selecting signal GRMP. The digital ramp generator 18 generates a digital ramp signal DRMP, which is a triangular wave that changes in synchronization with the analog ramp voltage ARMP.

That is, in accordance with an increasing timing of the analog ramp voltage ARMP, which is the same voltage level (or corresponding voltage level) as the voltage level of an input signal voltage VIN from the pixel section 11, the digital value of the digital ramp signal DRMP that corresponds to the voltage level of the analog ramp ARMP is stored in the latch section 14. This allows an analog-digital conversion for the input voltage from the pixel section 11.

Subsequent to the completion of the analog-digital conversion operation for one row as described above, the x-axis decoder 15 sequentially selects a latch section 14 in accordance with an inputted address signal XADDR. Next, the digital value of the latched digital ramp signal DRMP is sequentially output to a plurality of bit lines (herein, 8 bit or 10 bit, for example) as an analog-digital converting output signal DOUT.

A series of the analog-digital converting operations described above are performed on every row in the pixel arrangement, so that information of a digital image is output as image data.

Figure 2:
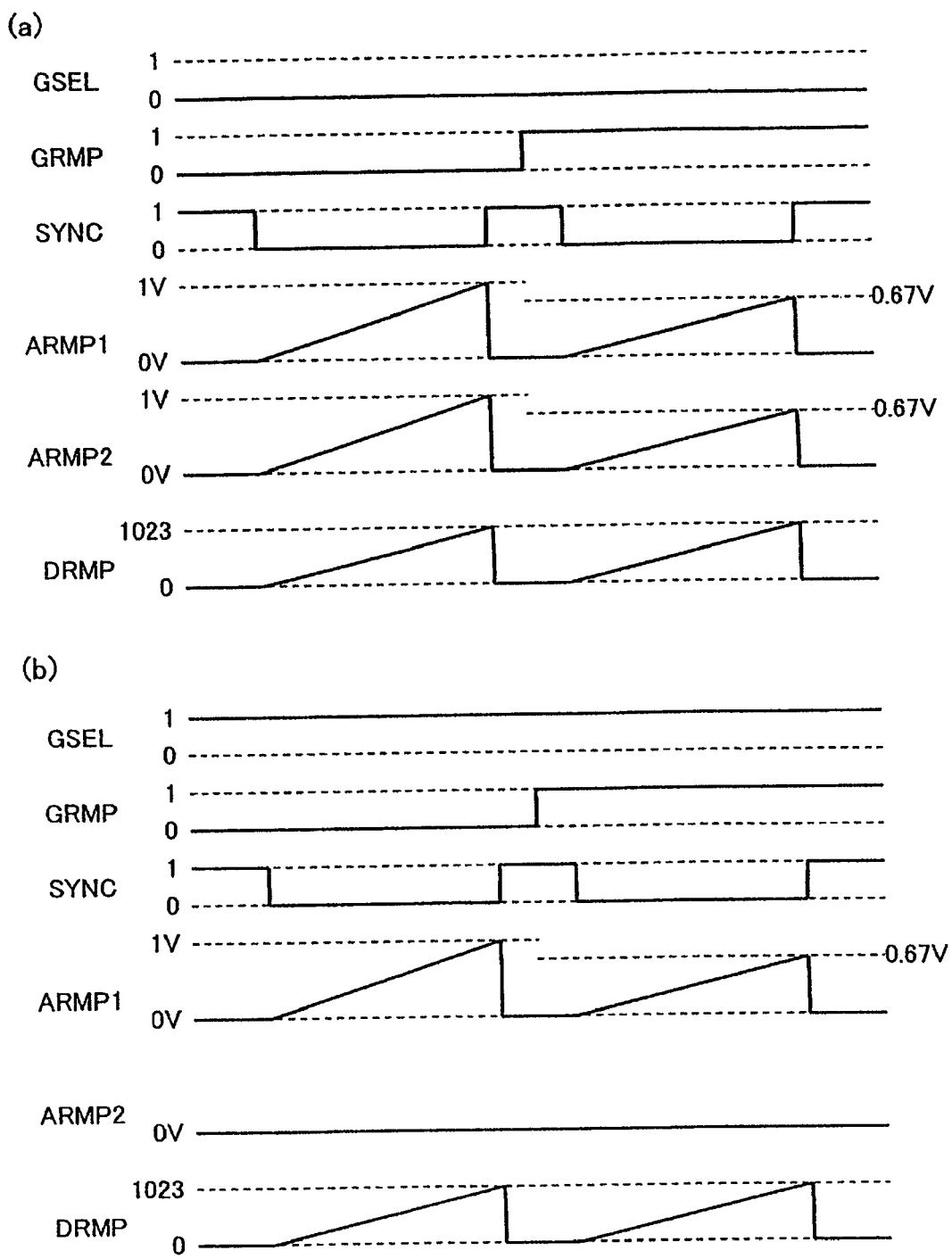
FIG. 2 is a timing chart showing an exemplary operation of the image sensor 10 shown in FIG. 1, in which (a) shows a case where the first gain selecting signal GSEL is "0", and (b) shows a case where the first gain selecting signal GSEL is "1".

FIG. 2 is a timing chart showing an exemplary operation of the image sensor 10 shown in FIG. 1, where (a) shows a case when the first gain selecting signal GSEL is "0", and (b) shows a case when the first gain selecting signal GSEL is "1". In addition, FIG. 2 shows the first gain selecting signal GSEL, the second gain selecting signal GRMP, the synchronizing signal SYNC, the first analog ramp signal ARMP1, the second analog ramp signal ARMP2, and the digital ramp signal DRMP.

When the first gain selecting signal GSEL is "0" as shown in FIG. 2(a), the second analog ramp signal ARMP2 becomes an output voltage of the gain selecting switch 17. At that time, the first analog ramp signal ARMP1 and the second analog ramp signal ARMP2 have the same voltage wave form, and both the first analog ramp signal ARMP1 and the second analog ramp signal ARMP2 are reset to 0V when the synchronizing signal SYNC is "1" whereas the first analog ramp signal ARMP1 and the second analog ramp signal ARMP2 sequentially increase at a constant tilt amount when the synchronizing signal SYNC is "0". In other words, when the synchronizing signal SYNC falls from "1" to "0", the voltage levels of the first analog ramp signal ARMP1 and the second analog ramp signal ARMP2 start to increase. The tilt amounts of the first analog ramp signal ARMP1 and the second analog ramp signal ARMP2 are set so that the analog ramp maximum voltage is 1V when the second gain selecting signal GRMP is "0" whereas the tilt amounts of the first analog ramp signal ARMP1 and the second analog ramp signal ARMP2 are set so that the analog ramp maximum voltage is 0.67V when the second gain selecting signal GRMP is "1".

When the first gain selecting signal GSEL is "1" as shown in FIG. 2(b), the first analog ramp signal ARMP1 is the same as the one in FIG. 2(a), and the second analog ramp signal ARMP2 is set to a fixed value of 0V by the gain selecting switch 17.

According to Embodiment 1 as described above, the first gain selecting signal GSEL and the second gain selecting signal GRMP are combined, so that the maximum value of the analog ramp voltage, which is the sum of the first analog ramp signal ARMP1 and the second analog ramp signal ARMP2, can be selected from 0.67V, 1V, 1.34V and 2V. A relative gain from the case where the maximum value of the additional voltage is 2V is 3 times, 2 times, 1.5 times and 1 time respectively. Further, applying Embodiment 1 allows the number of the combinations of gain selection to be easily increased, such as by changing the fixed voltage, changing the tilt amount, and changing the number of the analog ramp signals. Further, it is also feasible to provide only either of the first gain selecting section and the second gain selecting section.

Embodiment 2

In Embodiment 2, the comparator 13 used in the image sensor 10 according to Embodiment 1 as described above will be descried in detail.

Figure 3:
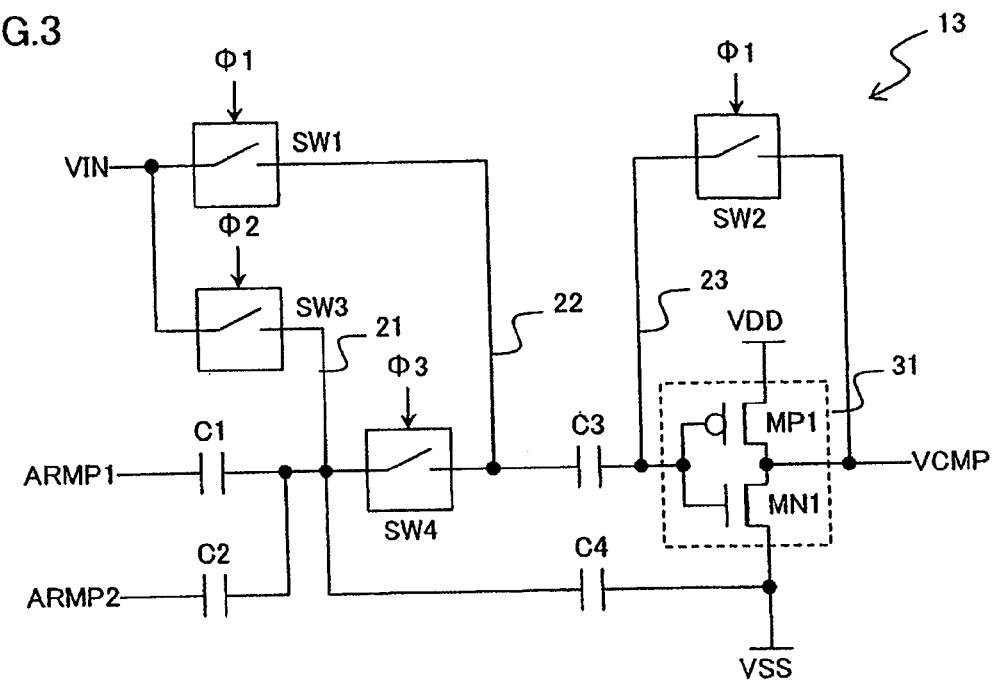
FIG. 3 is a circuit diagram showing an exemplary essential structure of the comparator according to Embodiment 2 of the present invention.

FIG. 3 is a circuit diagram showing an exemplary essential structure of the comparator according to Embodiment 2 of the present invention.

In FIG. 3, the comparator 13 includes: a switch SW1 and a switch SW2 for resetting; a switch SW3 for input sampling of an input signal voltage VIN; a switch SW4 for starting a comparison; a first capacitor C1 and a second capacitor C2 for sampling each analog value of the first analog ramp signal ARMP1 and the second analog ramp signal ARMP2; a capacitor C3 for comparison; a capacitor C4 for clarifying a comparison output; and a CMOS inverter 31 for a comparison output. Two data to be compared (an input signal voltage VIN and an adding voltage of analog values) are sequentially input into the comparator 13 and the two data are connected by the switch SW4, so that the two data are compared and a comparison result is output.

In the comparator 13, the input voltage VIN in each pixel section 11 is connected to a second connecting point 22 through the first switch SW1 as well as to a first connecting point 21 through the third switch SW3. In addition, the first analog ramp signal ARMP1 is connected to the first connecting point 21 through the first capacitor C1, and the second analog ramp signal ARMP2 is connected to the first connecting point 21 through the second capacitor C2. Furthermore, the first connecting point 21 and the second connecting point 22 are connected to each other through the fourth switch SW4, and the second connecting point 22 and the third connecting point 23 are connected with each other through the third capacitor C3. Moreover, the third connecting point 23 is connected to the input of the CMOS inverter 31 and the output of the CMOS inverter 31 is connected to the latch section 14 as a comparator output VCMP. The CMOS inverter 31 is connected in between the output of a high electric potential power source VDD and the output of a low electric potential power source VSS. Further, the output of the comparator output VCMP and the third connecting point 23 are connected to each other through the second switch SW2, and the first connecting point 21 is connected through the fourth capacitor C4 to a connecting section between the CMOS inverter 31 and the output of the low electric potential power source VSS.

That is, in the comparator 13 functioning as a comparing section, the input of the input signal voltage VIN is connected to the first connecting point 21 through the third switch SW3; the first analog ramp signal is connected to the first connecting point 21 through the first capacitor C1; the second analog ramp signal is connected to the first connecting point 21 through the second capacitor C2; the first connecting point 21 is connected to the input of the CMOS inverter 31 through a series circuit of the fourth switch SW4 and the third capacitor C3; and the output of the CMOS inverter 31 is connected to the output of comparator output VCMP, thereby configuring a sampling and comparing section. In addition, in the comparator 13, the input of the input signal voltage VIN is connected through the first switch SW1 to the second connecting point 22 in between the fourth switch SW4 and the third capacitor C3; the third connecting point 23 of inputs of the third capacitor C3 and the CMOS inverter 31 is connected to the output of the CMOS inverter 31 through the second switch SW2, thereby configuring a resetting section. Further, in the comparator 13, the CMOS inverter 31 is connected to the output of the low electric potential power source VSS, to which the first connecting point 21 is connected through the fourth capacitor C4. Note that the resetting section in FIG. 3 is only one example and it is not limited to this resetting section shown therein.

Figure 4:
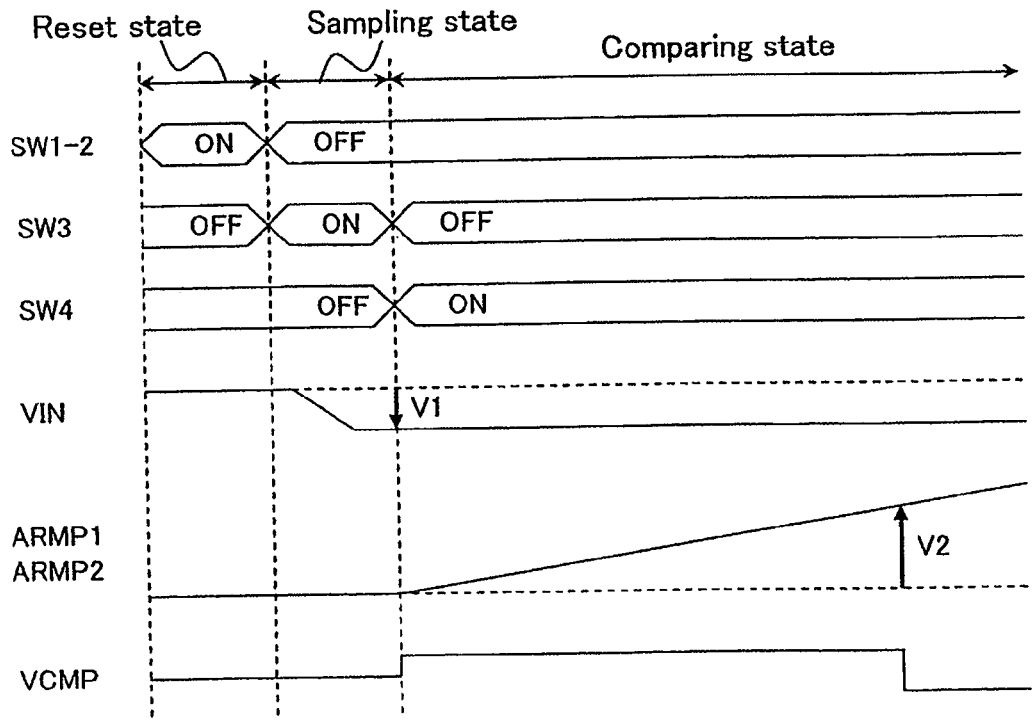
FIG. 4 is a timing chart showing an exemplary operation of the comparator shown in FIG. 3.

FIG. 4 is a timing chart showing an exemplary operation of the comparator 13 shown in FIG. 3. In addition, FIG. 4 shows on and off states of the switches SW1 to SW4, input voltage VIN from the pixel section 11, the adding voltage (V2) of the first analog ramp signal ARMP1 and the second analog ramp signal ARMP2, and the comparator output VCMP.

As shown in FIG. 4, the comparator 13 is first in the reset state when the first switch SW1 and the second switch SW2 are in on state and the third switch SW3 and the fourth switch SW4 are in off state. During the reset state, the input and output of the CMOS inverter 31 are reset to the equal voltage, and the reset voltage of the input voltage VIN from the pixel section 11 is charged in the third capacitor C3.

Next, the comparator 13 is in a sampling state when the first switch SW1, the second switch SW2 and the fourth switch SW4 are in off state and the third switch SW3 is in on state. During the sampling state, the input signal voltage VIN from the pixel section 11 is supplied to the first connecting section 21 and is charged to the first capacitor C1, the second capacitor C2 and the fourth capacitor C4. An input voltage V1 is the input reset voltage subtracted by the input voltage VIN.

Subsequently, the comparator 13 is in comparing state when the first switch SW1, the second switch SW2 and the third switch SW3 are in off state and only the fourth switch SW4 is in on state. During the comparing state, the voltage level changes when either or both of the first analog ramp signal ARMP1 and the second analog ramp signal ARMP2 are at the constant tilt, and the comparator output VCMP changes from "1" to "0" when the additional voltage of the first analog ramp signal ARMP1 and the second analog ramp signal ARMP2 reaches a predetermined voltage V2. At this time, a digital value of the digital ramp signal DRMP, which corresponds to the analog ramp voltage ARMP, is stored in the latch section 14.

A gain G, which is the ratio of the input voltage V1 and the voltage V2, is determined in the comparator 13 by the following equations (1) through (4) in accordance with the capacity ratio of the first capacitor C1, the second capacitor C2 and the third capacitor C3.

$$V2 = G \times V1 \qquad \text{equation (1)}$$

$$G = (C1 + C2 + C4)/C1 \qquad \text{equation (2)}$$

if the first analog ramp signal ARMP1 is changed and the second analog ramp signal ARMP2 is fixed.

$$G = (C1 + C2 + C4)/C2 \qquad \text{equation (3)}$$

if the first analog ramp signal ARMP1 is fixed and the second analog ramp signal ARMP2 is changed.

$$G = (C1 + C2 + C4)/(C1 + C2) \qquad \text{equation (4)}$$

if both the first analog ramp signal ARMP1 and the second analog ramp signal ARMP2 are changed.

The comparator output VCMP from the comparator 13 is connected to the latch section 14 in the later part, and it is converted into a digital signal by the CMOS inverter 31 and is used to operate the latch section 14.

In Embodiment 2, although two analog ramp signals, ARMP1 and ARMP2, are input in the comparator 13, another analog ramp signal can be further added to the comparator 13 and connected to the first connecting point 21 through an additional capacitor. As a result, the number of the combinations of the gain can be easily increased by a plurality of analog ramp signals.

In this case, the gain G, which is the ratio of the input voltage V1 and the predetermined voltage V2, is determined in the comparator 13 by the following equations (1) and (2″) through (4″) in accordance with the capacity ratio of the first capacitor C1, the second capacitor C2 ... the n-th capacitor Cn, a capacitor C for comparing (C3 in Embodiment 1) and an additional capacitor CT (C4 in Embodiment 4).

$$V2 = G \times V1 \qquad \text{equation (1)}$$

$$G = (C1 + C2 + CT)/C1 \qquad \text{equation (2″)}$$

if the first analog ramp signal ARMP1 is changed and the second analog ramp signal ARMP2 is fixed.

$$G = (C1 + C2 + CT)/C2 \qquad \text{equation (3″)}$$

if the first analog ramp signal ARMP1 is fixed and the second analog ramp signal ARMP2 is changed.

$$G = (C1 + C2 + CT)/(C1 + C2) \qquad \text{equation (4″)}$$

if both the first analog ramp signal ARMP1 and the second analog ramp signal ARMP2 are changed.

That is, a gain G, which is the ratio of the input voltage V1 and the predetermined voltage V2, is determined in the comparing section by dividing the sum of respective capacitance of the first capacitor, the second capacitor ... the n-th capacitor and the additional capacitor by the sum of respective capacitors that correspond to one or a plurality of analog ramp signals when one or a plurality of the analog ramp signals of the first analog ramp signal, the second analog ramp signal . . . the n-th analog ramp signal are changed and the rest of the analog ramp signals is fixed.

Figure 5:
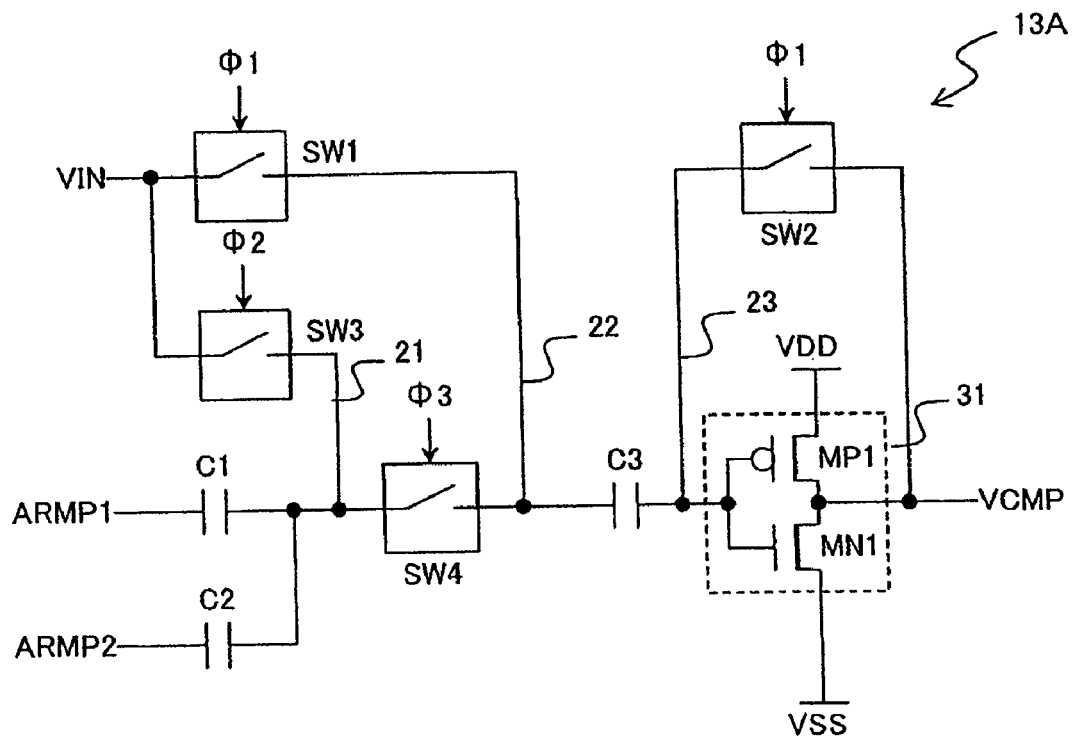
FIG. 5 is a circuit diagram showing an exemplary variation of the comparator in FIG. 3.

In addition, although not specifically explained in Embodiment 2, a conventional comparator includes a capacitor for sampling, the capacitor having a capacity in which the capacities of the first capacitor C1 and the second capacitor C2 in FIG. 3 are added. The total capacity value in FIG. 3 is the same as that of the conventional comparator, and a chip area in the comparator will not increase due to the addition of the second capacitor C2. Further, the fourth capacitor C4 may be eliminated to reduce the chip area in a comparator 13A as shown in FIG. 5. In FIG. 3, the fourth capacitor C4 is provided and the difference will be obvious when compared with the comparator 13A.

The case in FIG. 5 will be further described where the fourth capacitor C4 is not provided. In the comparator 13, the input of the input signal voltage VIN is connected to the first connecting point 21 through the third switch SW3; the first analog ramp signal is connected to the first connecting point 21 through the first capacitor C1; the second analog ramp signal is connected to the first connecting point 21 through the second capacitor C2; the first connecting point 21 is connected to the input of the CMOS inverter 31 through a series circuit of the fourth switch SW4 and the third capacitor C3; and the output of the CMOS inverter 31 is connected to the output of the comparator output VCMP, thereby configuring a sampling and comparing section. In addition, in the comparator 13, the input of the input signal voltage VIN is connected to the second connecting point 22 in between the fourth switch SW4 and the third capacitor C3 through the first switch SW1; and the third connecting point 23 in between the third capacitor C3 and the input of the CMOS inverter 31 is connected to the output of the CMOS inverter 31 through the second switch SW2, thereby configuring a resetting section.

The function of the comparator 13 will be described. The comparator 13 is in a reset state when the first switch SW1 and the second switch SW2 are in on state and the third switch SW3 and the fourth switch SW4 are in off state. The input and output of the CMOS inverter 31 are reset to the equal voltage, and the input reset voltage is charged into the third capacitor C3. In addition, the comparator 13 is in a sampling state when the first switch SW1, the second switch SW2 and the fourth switch SW4 are in off state and the third switch SW3 is in on state; and the input signal voltage VIN is charged into the first capacitor C1 and the second capacitor C2. The input voltage V1 is a difference between the input reset voltage and the input signal voltage VIN. At this time, the comparator 13 is in a comparing state when the first switch SW1, the second switch SW2 and the third switch SW3 are in off state and the fourth switch SW4 is in on state. In this case, the comparator output changes when the voltage level changes with either or both of the first analog ramp signal ARMP1 and the second analog ramp signal ARMP2 at the constant tilt and the added voltage of the first analog ramp signal ARMP1 and the second analog ramp signal ARMP2 reaches a predetermined voltage V2.

The gain G, which is the ratio of the input voltage V1 and the predetermined voltage V2, is determined in the comparator 13 by the following equations (1) and (2') through (4') in accordance with the capacity ratio of the first capacitor C1, the second capacitor C2 and the third capacitor C3.

$$V2 = G \times V1 \qquad \text{equation (1)}$$

$$G = (C1+C2)/C1 \qquad \text{equation (2')}$$

if the first analog ramp signal ARMP1 is changed and the second analog ramp signal ARMP2 is fixed by a predetermined value (0V, for example).

$$G = (C1+C2)/C2 \qquad \text{equation (3')}$$

if the first analog ramp signal ARMP1 is fixed and the second analog ramp signal ARMP2 is changed.

$$G = (C1+C2)/(C1+C2) \qquad \text{equation (4')}$$

if both the first analog ramp signal ARMP1 and the second analog ramp signal ARMP2 are changed.

That is, a gain G, which is the ratio of the input voltage V1 and the predetermined voltage V2, is determined in the comparing section by dividing the sum of respective capacitance of the first capacitor, the second capacitor . . . the n-th capacitor by the sum of respective capacitors that correspond to one or a plurality of analog ramp signals when one or a plurality of the analog ramp signals of the first analog ramp signal, the second analog ramp signal . . . the n-th analog ramp signal are changed and the rest of the analog ramp signals is fixed.

Figure 6:
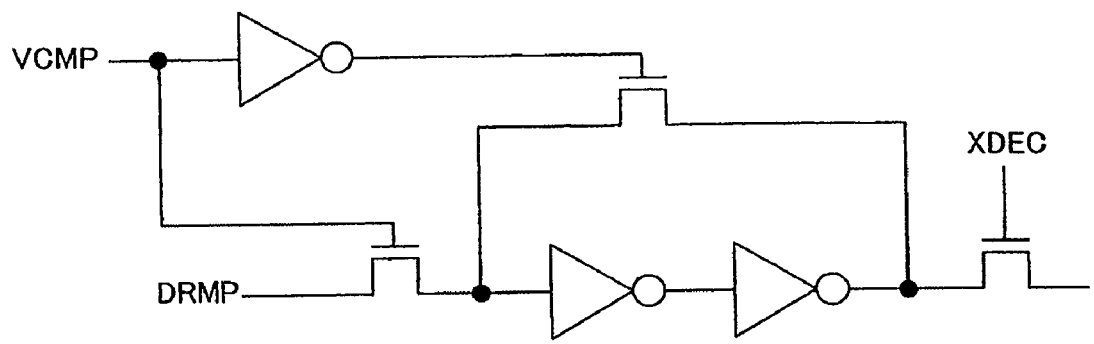
FIG. 6 is a circuit diagram showing an exemplary structure of the latch section for storing 1 bit shown in FIG. 1.

Further, although not specifically explained in Embodiment 1 described above, a circuit configuration of the latch section 14 for storing 1 bit is specifically shown in FIG. 6. As shown in FIG. 6, when the comparator output VCMP is at the high level, the digital value of the digital ramp signal DRMP is input to a series inverter circuit. When the comparator output VCMP is at the low level, the digital value of the inputted digital ramp signal DRMP is maintained. The digital value of the maintained digital ramp signal DRMP is output by an output controlling signal from the x-axis decoder 15 (XDEC). The number of the latch section provided is the same as the number of the bit (8 bit or 10 bit, herein).

Embodiment 3

In Embodiment 3, the analog ramp generator 16, which is used in the image sensor 10 of Embodiment 1, will be explained in detail.

Figure 7:
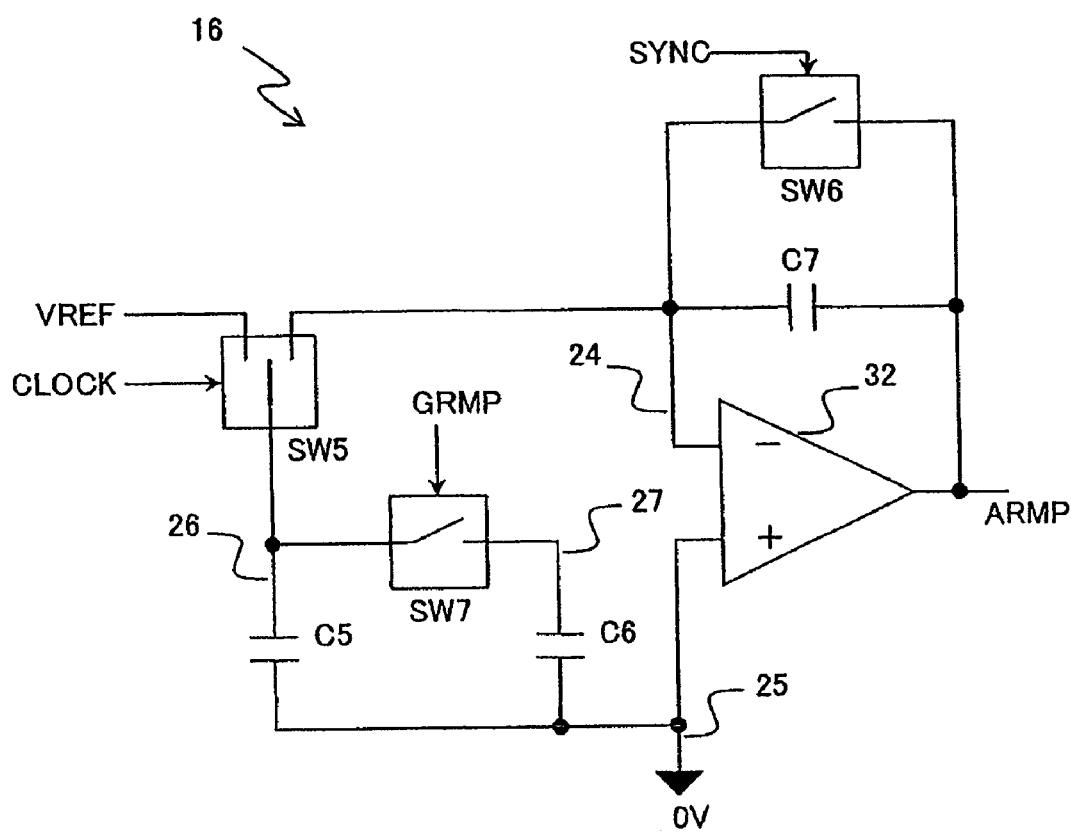
FIG. 7 is a circuit diagram showing an exemplary essential structure of the analog ramp generator according to Embodiment 3 of the present invention.
Figure 8:
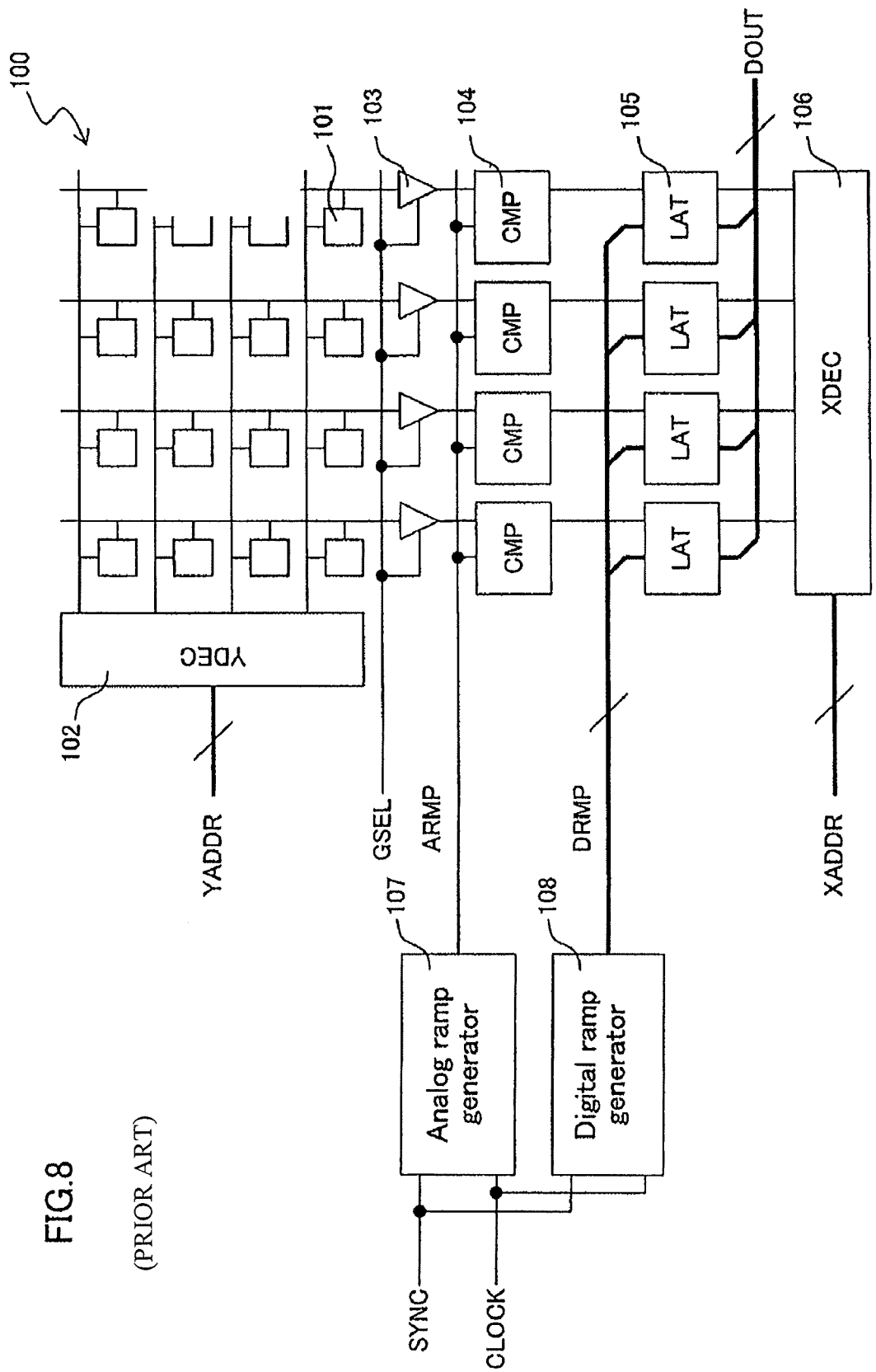
FIG. 8 is a block diagram showing an exemplary essential structure of a conventional image sensor.

FIG. 7 is a circuit diagram showing an exemplary essential structure of the analog ramp generator according to Embodiment 3 of the present invention.

In FIG. 7, the analog ramp generator 16 includes three switches SW5-SW7, three capacitors C5-C7, and one differential amplifier 32.

In the analog ramp generator 16, the output of the differential amplifier 32 is connected to the output of the analog ramp generator output ARMP, and the negative input of the differential amplifier 32 is connected to a fourth connecting point 24. In addition, the output of the analog ramp generator output ARMP is connected to the fourth connecting point 24 through a parallel circuit of the seventh capacitor C7 and the sixth switch SW6. Further, the positive input of the differential amplifier 32 is connected to the fifth connecting point 25 (fixed value output), which is an analog ground point, and the sixth connecting point 26 is connected to the fifth connecting point 25, which is an analog ground point, through the fifth capacitor C5. Further, the sixth connecting point 26 is connected to the fifth connecting point 25, which is an analog ground point, through a series circuit of the seventh switch SW7 and the sixth capacitor C6. Further, the sixth connecting point 26 is connected to either the input of a reference voltage VREF or the fourth connecting point 24 through the fifth switch SW5.

In the analog ramp generator 16, the sixth switch SW6 is controlled to open and close by synchronizing signal SYNC. When the synchronizing signal SYNC is "1", the analog ramp signal ARMP which is an analog ramp generator output is reset to the voltage value 0V.

In addition, in the analog ramp generator 16, the second gain selecting signal GRMP controls to open and close the seventh switch SW7. When the second gain selecting signal GRMP is "1", the fifth capacitor C5 and the sixth capacitor C6 are connected in parallel. The second gain selecting section is configured by the seventh switch SW7, the fifth capacitor C5 and the sixth capacitor C6, thereby changing the tilt amount of the analog ramp signal ARMP (the tilt amount of the triangular wave in which the voltage level sequentially increases).

Further, the fifth switch is switch-controlled by the clock signal CLOCK. When the synchronizing signal SYNC is "0" and the second gain selecting signal GRMP is "0", the electric charge of the fifth capacitor C5 is transferred to the seventh capacitor C7. In addition, when the synchronizing signal SYNC is "0" and the second gain selecting signal GRMP is "1", the electric charges of the fifth capacitor C5 and the sixth capacitor C6 are transferred to the seventh capacitor C7.

For example, if the capacity values of the fifth capacitor C5 and the sixth capacitor C6 are set to be equal and the capacity value of the seventh capacitor C7 is set to be 1024 times that of the fifth capacitor C5, the voltage value of the analog ramp signal ARMP which is an analog ramp generator output when the clock signal CLOCK is counted for 1024 times becomes equal to the reference voltage VREF when the second gain selecting signal GRMP is "0" and the voltage value becomes twice the reference voltage VREF when the second gain selecting signal GRMP is "1". Therefore, the tilt amount of the analog ramp signal can be selected in two ways according to the analog ramp generator 16 of Embodiment 3.

Although the tilt amount of the analog ramp signal ARMP is in two ways in Embodiment 3, the number of selection for the tilt amount of the analog ramp signal ARMP can be easily increased by adding an additional capacitor to the capacitor C5 or C6 in parallel through an additional switch.

In this case, additional series circuits, which is the same as a series circuit of the seventh switch SW7 and the sixth capacitor C6, are provided in such a manner that the series circuit of the seven–1st switch and the six–1st capacitor . . . a series circuit of the seven–mth switch and the six–mth capacitor are in parallel with each other (m is a positive integer).

In the analog ramp generator, the sixth switch SW6 is controlled to open and close by the synchronizing signal, and the analog ramp generator is reset to the voltage value 0V when the synchronizing signal is "1". The second gain selecting signal is configured with a plurality of gain selecting signals, and the seven–mth switch is controlled to open and close by the plurality of gain selecting signals, so that one or a plurality of the six–nth capacitors, which correspond to the gain selecting signal "1" of the plurality of gain selecting signals, and the fifth capacitor are connected in parallel. The fifth switch is switched by the clock signal, and the electric charge of the fifth capacitor C5 is transferred to the seventh capacitor C7 when the synchronizing signal is "0" and the second gain selecting signal is "0". When the synchronizing signal is "0" and the plurality of gain selecting signals are "1", the electric charges of one or a plurality of the six–mth capacitors and the fifth capacitor C5 are transferred to the seventh capacitor C7. As a result, the number of selection m+1 of the tilt amount for the analog ramp signals ARMP are increased in a synergistic manner corresponding to the first gain selecting signal GSEL.

With the structures described above and according to Embodiments 1 to 3, the analog-digital converter 20 includes a comparator 13 for comparing the input signal voltage VIN and the analog ramp voltage which gradually increases the voltage level, and a latch section 14 for storing a digital value of the digital ramp signal DRMP which is changed in synchronization with the analog ramp voltage ARMP when the input signal voltage VIN and the analog ramp voltage are equal. The analog-digital converter 20 uses a voltage, which is the sum of a plurality of analog ramp signals ARMP1 and ARMP2, as an analog ramp voltage ARMP and switches the gain selecting switch 17 by the first gain selecting signal GSEL, so that at least one of the plurality of analog ramp signals ARMP1 and ARMP2 is changed to a fixed voltage to select again. In addition, the tilt amounts of the analog ramp signals ARMP1 and ARMP2, which are output from the analog ramp generator 16 by the second gain selecting signal, are changed together to select a gain. As a result, the image sensor 10, which is a solid-state image capturing apparatus, need not to be equipped with amplifiers as a gain selecting section for every column as in prior art, making it possible to select a gain accurately, to decrease an area occupied by circuits and to reduce the electric power consumption.

Although not specifically explained in Embodiments 1 to 3, there are provided a comparator 13 for comparing the input signal voltage VIN and the analog ramp voltage in which the voltage level gradually increases, and a latch section 14 for storing a digital value of the digital ramp signal DRMP, in which the digital value of the voltage level gradually increases in synchronization with the analog ramp voltage when the analog ramp voltage or the voltage corresponding to the analog ramp voltage and the input signal voltage VIN are equal, so that the voltage in which part or all of the plurality of analog ramp signals are added is used as the analog ramp voltage, making it possible to select a gain. As a result, amplifiers as a gain selecting section need not to be provided for every column, thereby achieving the objective of the present invention to select a gain accurately, to decrease an area occupied by circuits and to reduce the electric power consumption.

Further, although not specifically explained in Embodiments 1 to 3 described above, an electronic information device will be described, the electronic information device including an image input device, such as a digital camera (e.g., digital video camera and digital still camera), an image input camera (e.g., a monitoring camera, a door intercom camera, a car-mounted camera, and a camera for television telephone, and a camera equipped in a cell phone), and an image input device (e.g., a scanner, a facsimile machine and a camera-equipped cell phone device) using the image sensor 10 according to Embodiments 1 to 3 described above as an image capturing section.

Figure 9:
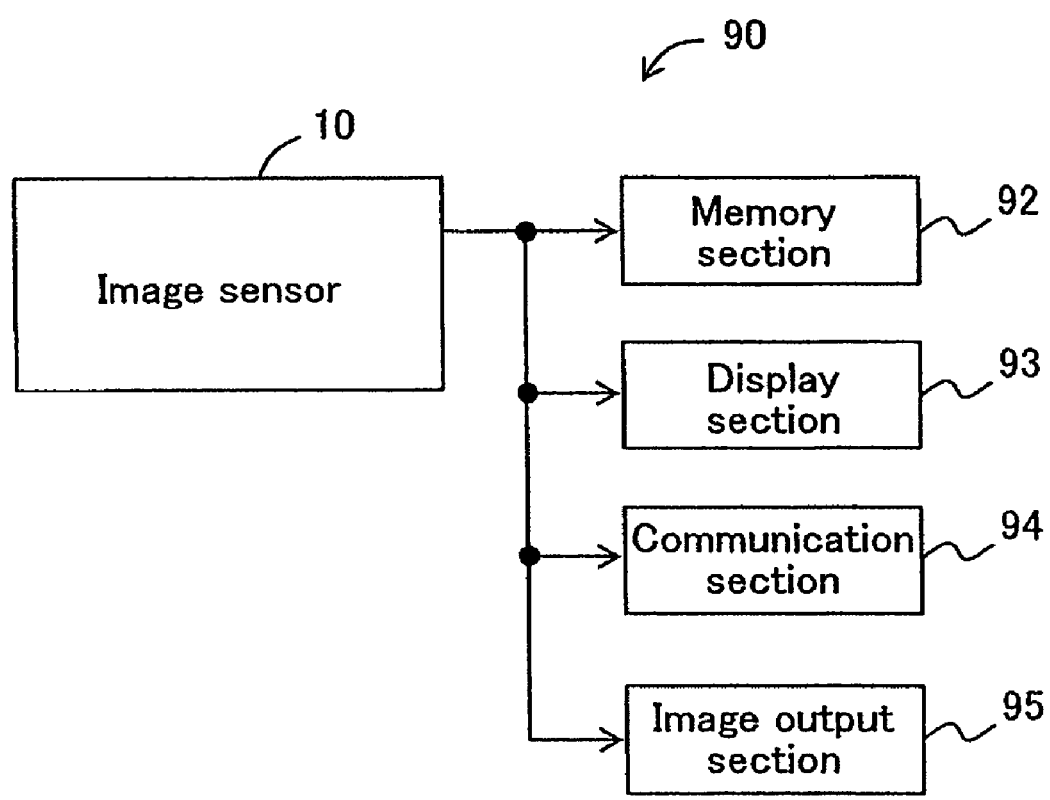
FIG. 9 is a block diagram showing an exemplary schematic structure of an electronic information device using an image sensor 10 according to Embodiments 1 to 3 of the present invention for an image capturing section thereof.

FIG. 9 is a block diagram showing an exemplary schematic structure of an electronic information device using an image sensor 10 according to Embodiments 1 to 3 of the present invention for an image capturing section thereof.

In FIG. 9, the electronic information device 90 according to the present invention includes at least any of: a memory section 92 (e.g., recording media) for data-recording a high-quality image data obtained by using the image sensor 10 according to Embodiments 1 to 3 of the present invention described above as the image capturing section after a predetermined signal process is performed on the image dada for recording; a display section 93 (e.g., liquid crystal display device) for displaying this image data on a display screen (e.g., liquid crystal display screen) after a predetermined signal process is performed on the image data for display; a communication section 94 (e.g., transmitting and receiving device) for communicating this image data after a predetermined signal process is performed on the image data for communication; and an image output section 95 for printing (typing out) and outputting (printing out) this image data.

As described above, the present invention is exemplified by the use of its preferred Embodiments 1 to 3. However, the present invention should not be interpreted solely based on Embodiments 1 to 3 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 3 of the present invention. Furthermore, it is understood that any patent, any patent application and any references cited in the present specification should be incorporated by reference in the present specification in the same manner as the contents are specifically described therein.

INDUSTRIAL APPLICABILITY

According to the present invention, in the field of an analog-digital converter in which a gain can be selected when an analog image signal is converted into a digital image signal and the digital image is output; a solid-state image capturing apparatus using the analog-digital converter to make it possible to capture an image light from a subject; and an electronic information device, such as a digital camera (e.g., a digital video camera, a digital still camera), an image input scanner, a facsimile, a cell phone device equipped with a camera and the like, using the solid-state image capturing apparatus as an image input device for an image capturing section, the analog ramp signal and the fixed voltage are changed by the gain selecting signal and the switch; and the tilt amount of the triangular wave is changed so as to select a gain without using a plurality of amplifiers as a gain selecting section for each column. As a result, an area occupied by chips is decreased and the electric power consumption is reduced since a plurality of amplifiers are not necessary to be provided, compared with a prior art. In addition, the accuracy of a gain is controllable with a capacity ratio of a capacitor that configures a comparison circuit, so that an influence due to the production tolerance can be reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An analog-digital converter, comprising:
 a comparing section for comparing an input signal voltage and an analog ramp voltage in which a voltage level gradually increases; and
 a latch section for storing a digital value of a digital ramp signal, in which a digital value of a voltage level gradually increases in synchronization with the analog ramp voltage, when the analog ramp voltage or a voltage corresponding to the analog ramp voltage, and the input signal voltage are equal;
 wherein a voltage in which a plurality of analog ramp signals are added is used as the analog ramp voltage so that a gain is selectable, and
 wherein the analog-digital converter does not require an amplifier for gain selection.

2. An analog-digital converter according to claim 1, further including an analog ramp generating section for generating the analog ramp signal and a digital ramp generating section for generating the digital ramp signal.

3. An analog-digital converter according to claim 2, further including a first gain selecting section for branching an output of the analog ramp signal from the analog ramp generating section into a plurality of outputs to allow at least one of the outputs to be switched to a fixed voltage output.

4. An analog-digital converter according to claim 3, wherein the first gain selecting section is a gain selecting switch, the gain selecting switch switching between at least one of the plurality of analog ramp signals and the fixed voltage by the first gain selecting signal so that a gain is selectable.

5. An analog-digital converter according to claim 2, wherein the analog ramp generating section includes a second gain selecting section for changing a tilt amount of the analog ramp signal.

6. An analog-digital converter according to claim 2,
 wherein, in the analog ramp generating section, the output of a differential amplifier is connected to an output of an analog ramp generating output, and the output of the analog ramp generating output is connected to the negative input of the differential amplifier through a parallel circuit of the seventh capacitor and the sixth switch;
 wherein the positive input of the differential amplifier is connected to an analog ground point, and a sixth connecting point is connected to the analog ground point through a fifth capacitor as well as to the analog ground point through a series circuit of a seventh switch and a sixth capacitor; and
 wherein the sixth connecting point is connected to the input of a reference voltage or the negative input of the differential amplifier through a fifth switch.

7. An analog-digital converter according to claim 6, wherein additional series circuits, which are the same as the series circuit of the seventh switch and the sixth capacitor, are provided in such a manner that a series circuit of the seven-1st switch and the six-1st capacitor . . . a series circuit of a seven-mth switch and a six-mth capacitor are in parallel with each other.

8. An analog-digital converter according to claim 7,
 wherein, in the analog ramp generating section, the sixth switch is controlled to open and close by a synchronizing signal, and the analog ramp generating output is reset to the voltage value of 0V when the synchronizing signal is "1";
 wherein a second gain selecting signal is configured with a plurality of gain selecting signals, and the seven-mth switch is controlled to open and close by the plurality of gain selecting switch, and one or a plurality of the six-nth capacitors, which correspond to the gain selecting signal "1" of the plurality of gain selecting signals, and the fifth capacitor are connected in parallel;
 wherein the fifth switch is switch-controlled by the clock signal, and electric charge of the fifth capacitor is transferred to the seventh capacitor when the synchronizing signal is "0" and the second gain selecting signal is "0"; and
 wherein electric charges of one or a plurality of the six-mth capacitors and the fifth capacitor are transferred to the seventh capacitor when the synchronizing signal is "0" and the plurality of gain selecting signals are "1".

9. An analog-digital converter according to claim 6,
 wherein, in the analog ramp generating section, the sixth switch is controlled to open and close by a synchronizing signal, and the analog ramp generating output is reset to the voltage value of 0V when the synchronizing signal is "1";

wherein the seventh switch is controlled to open and close by a second gain selecting signal, and the fifth capacitor and the sixth capacitor are connected in parallel when the second gain selecting signal is "1";

wherein the fifth switch is switch-controlled by a clock signal, and electric charge of the fifth capacitor is transferred to the seventh capacitor when the synchronizing signal is "0" and the second gain selecting signal is "0"; and wherein electric charges of the fifth capacitor and the sixth capacitor are transferred to the seventh capacitor when the synchronizing signal is "0" and the second gain selecting signal is "1".

10. An analog-digital converter according to claim 1, wherein, in the comparing section, an input of the input signal voltage is connected to a first connecting point through a third switch;

a first analog ramp signal is connected to the first connecting point through a first capacitor; a second analog ramp signal is connected to the first connecting point through a second capacitor . . . and an n-th analog ramp signal is connected to the first connecting point through an n-th capacitor (n is an integer greater or equal to 2);

the first connecting point is connected to the input of a CMOS inverter through a series circuit of a fourth switch and a comparing capacitor; and the output of the CMOS inverter is connected to the output of a comparator output, thereby configuring a sampling and comparing section.

11. An analog-digital converter according to claim 10, wherein, in the comparing section, the input of the input signal voltage is connected through a first switch to a second connecting point in between the fourth switch and the comparing capacitor, and a third connecting point in between the comparing capacitor and inputs of the CMOS inverter is connected to the output of the CMOS inverter through a second switch, thereby configuring a resetting section.

12. An analog-digital converter according to claim 11, wherein, in the comparing section, the CMOS inverter is connected in between outputs of a high electric potential power source and a low electric potential power source, and the first connecting point is connected to the output of the low electric potential power source through an additional capacitor.

13. An analog-digital converter according to claim 12, wherein the comparing section is in a reset state when the first switch and the second switch are in the on state and the third switch and the fourth switch are in the off state; and the input and output of the CMOS inverter are reset to the equal voltage; and the input reset voltage is charged to the comparing capacitor;

wherein the comparing section is in a sampling state when the first switch, the second switch and the fourth switch are in the off state and the third switch is in the on state; and the input signal voltage is charged to the first capacitor, the second capacitor . . . the n-th capacitor and the additional capacitor, and the input voltage V1 is a difference between the input reset voltage and the input signal voltage; and wherein, the comparing section is in a comparing state when the first switch, the second switch and the third switch are in the off state and the fourth switch is in the on state, and the voltage level changes with the constant tilt amount of at least one of the first analog ramp signal, the second analog ramp signal . . . and the n-th analog ramp signal, and the comparator output changes at the time when an added voltage of the first analog ramp signal, the second analog ramp signal . . . and the n-th analog ramp signal reaches a predetermined voltage V2.

14. An analog-digital converter according to claim 13, wherein a gain G, which is the ratio of the input voltage V1 and the predetermined voltage V2, is determined in the comparing section by dividing the sum of respective capacitance of the first capacitor, the second capacitor . . . the n-th capacitor and the additional capacitor by the sum of respective capacitors that correspond to one or a plurality of analog ramp signals when one or a plurality of the analog ramp signals of the first analog ramp signal, the second analog ramp signal . . . the n-th analog ramp signal are changed and the rest of the analog ramp signals is fixed.

15. An analog-digital converter according to claim 11, wherein, when the first switch and the second switch are in the on state and the third switch and the fourth switch are in the off state, the comparing section is in the reset state and the input and output of the CMOS inverter are reset to the equal voltage, and an input reset voltage is charged in the comparing capacitor.

16. An analog-digital converter according to claim 11, wherein, when the first switch, the second switch and the fourth switch are in the off state and the third switch is in the on state, the comparing section is in a sampling state, and the input signal voltage is charged to the first capacitor, the second capacitor . . . and the n-th capacitor; and an input voltage V1 is a difference between a input reset voltage, which is charged to the comparing capacitor during a resetting period, and the input signal voltage;

wherein, when the first switch, the second switch and the third switch are in the off state and the fourth switch is in the on state, the comparing section is in a comparing state and the voltage level changes with the constant tilt amount of at least either of the first analog ramp signal and the second analog ramp signal, and the comparing output changes at the time when an added voltage of the first analog ramp signal, the second analog ramp signal . . . and the n-th analog ramp signal reaches a predetermined voltage V2.

17. An analog-digital converter according to claim 16, wherein a gain G, which is the ratio of the input voltage V1 and the predetermined voltage V2, is determined in the comparing section by dividing the sum of respective capacitance of the first capacitor, the second capacitor . . . the n-th capacitor by the sum of respective capacitors that correspond to one or a plurality of analog ramp signals when one or a plurality of the analog ramp signals of the first analog ramp signal, the second analog ramp signal . . . the n-th analog ramp signal are changed and the rest of the analog ramp signals is fixed.

18. An analog-digital converter according to claim 10, wherein, when the third switch is in the on state, the comparing section is in a sampling state and the input signal voltage is charged to the first capacitor, the second capacitor, . . . and the n-th capacitor;

wherein an input voltage V1 is a difference between an input reset voltage and the input signal voltage, the input reset voltage charged to the comparing capacitor during a resetting period; and wherein, when the third switch is in the off state and the fourth switch is in the on state, the comparing section is in a comparing state and the voltage level changes with the constant tilt amount of at least one of the first analog ramp signal, the second analog ramp signal . . . and the n-th analog ramp signal, and the comparing output changes at the time when an added voltage of the first analog ramp signal, the second analog ramp signal . . . and the n-th analog ramp signal reaches a predetermined voltage V2.

19. An analog-digital converter according to claim 18, wherein a gain G, which is the ratio of the input voltage V1 and the predetermined voltage V2, is determined in the comparing section by dividing the sum of respective capacitance of the first capacitor, the second capacitor . . . the n-th capacitor by the sum of respective capacitors that correspond to one or a plurality of analog ramp signals when one or a plurality of the analog ramp signals of the first analog ramp signal, the second analog ramp signal . . . the n-th analog ramp signal are changed and the rest of the analog ramp signals is fixed.

20. A solid-state image capturing apparatus, comprising:
a plurality of pixel sections arranged in a matrix for photoelectrically converting an incident light into an electron and outputting it as an input signal voltage;
a y-axis decoder for sequentially selecting each column in a pixel arrangement; an x-axis decoder for selecting each row in a pixel arrangement; and
an analog-digital converter according to claim 1.

21. An electronic information device using the solid-state image capturing apparatus according to claim 20.

22. An electronic information device using the analog-digital converter according to claim 1.

\* \* \* \* \*